United States Patent
Smith

(10) Patent No.: US 7,196,890 B2
(45) Date of Patent: Mar. 27, 2007

(54) ELECTROSTATIC DISCHARGE PROTECTION POWER RAIL CLAMP WITH FEEDBACK-ENHANCED TRIGGERING AND CONDITIONING CIRCUITRY

(75) Inventor: Jeremy Charles Smith, Austin, TX (US)

(73) Assignee: Texas Instruments Incorporated, Dallas TX (*) Notice: Subject to any disclaimer, the term of this patent is extended or adjusted under 35 U.S.C. 154(b) by 0 days.

(21) Appl. No.: 10/987,359

(22) Filed: Nov. 12, 2004

(65) Prior Publication Data

US 2006/0103998 A1 May 18, 2006

(51) Int. Cl.
*H02H 3/20* (2006.01)
*H02H 3/22* (2006.01)
*H02H 9/04* (2006.01)

(52) U.S. Cl. .................. 361/91.1; 361/91.1; 361/56; 361/111

(58) Field of Classification Search ............... 361/56, 361/111, 91.1
See application file for complete search history.

(56) References Cited

U.S. PATENT DOCUMENTS

| | | | | |
|---|---|---|---|---|
| 5,311,391 | A | * 5/1994 | Dungan et al. | 361/56 |
| 5,508,649 | A | * 4/1996 | Shay | 327/318 |
| 5,589,790 | A | * 12/1996 | Allen | 327/333 |
| 6,552,886 | B1 | * 4/2003 | Wu et al. | 361/56 |

OTHER PUBLICATIONS

A. Sedra et al. Microelectronic Circuits, 1987, Holt, Rinehart and Winston, pp. 342-345.*

* cited by examiner

*Primary Examiner*—Brian Sircus
*Assistant Examiner*—Zeev Kitov
(74) *Attorney, Agent, or Firm*—Alan K. Stewart; W. James Brady; Frederick J. Telecky, Jr.

(57) ABSTRACT

Electrostatic discharge protection circuitry includes a timing circuit operably coupled between the high supply side and low supply side of an associated circuit. The timing circuit has an RC node used for triggering a series of inverters configured to control an ESD dissipation device operably coupled to the high supply side node and the low side supply node of the circuit. A feedback transistor network and a feedback conditioning network is provided for ensuring that the ESD device is held on during an ESD event.

12 Claims, 3 Drawing Sheets

ELECTROSTATIC DISCHARGE PROTECTION POWER RAIL CLAMP WITH FEEDBACK-ENHANCED TRIGGERING AND CONDITIONING CIRCUITRY

TECHNICAL FIELD

The invention relates to semiconductor devices and microelectronic circuitry. More particularly, it relates to electrostatic discharge (ESD) protection circuits.

BACKGROUND OF THE INVENTION

Electrostatic discharge (ESD) events can cause damage to elements of circuitry due to excessively high voltages or currents. For example, the propagation of an ESD event through a circuit may cause a transistor to greatly exceed its voltage or current capacity, suffer physical damage, and subsequently fail. The potential for failure increases as circuitry becomes smaller and as operating voltage levels are reduced. ESD events may occur due to a relatively short period of relatively high voltage or current imposed on a device. For example, ESD events are sometimes caused by contact with the human body, by machinery such as manufacturing or test equipment, or in electrically active environments, as may be incurred in many consumer applications. A variety of ESD events can occur in electronic devices, including discharge between the pads of an integrated circuit, discharge between voltage supply terminals, and discharge between pads and voltage supply terminals. Various kinds of ESD protection circuitry are used in the art to protect ICs from damage due to the occurrence of ESD events during manufacture, testing, and operation. In general, ESD protection circuitry is designed to protect the input/output circuitry and internal circuitry of an integrated circuit from excessively large and sudden discharges of electrostatic energy.

Integrated circuits must be protected against electrostatic discharges in order to prevent permanent damage that can impair or eliminate desired functionality. ESD damage normally occurs in the MOSFET devices or interconnecting layers used to couple MOSFETs together to form a circuit. Each pin in an integrated circuit must be coupled to an appropriate ESD protection circuit such that the ESD discharge current is shunted away from the internal portions of the chip that are the most sensitive to damage. As such, ESD discharge paths must be provided between every pair of pins in an IC for both positive and negative polarities.

The objective for ESD protection in general is to provide a shunting path for each potentially damaging ESD path. A shunting path is required to the top rail for ESD currents produced by ESD potentials applied to the protected node which are significantly more positive than anywhere else on the IC. Similarly, a shunting path is desirable for ESD currents that are produced by ESD potentials that are significantly more negative than elsewhere on the IC. A rail clamp is desirable to provide a coupling between the top and bottom rails for those ESD paths that require such a coupling in order to complete the discharge loop. In general, the goal is to keep the maximum voltage in the discharge loop within acceptable limits.

Just as ESD pulses can be applied between the I/O pads and the supply rails, ESD discharges can occur between the power supply rails. For example, for top rail to bottom rail stress, ESD current typically flows through a rail clamp from the top rail to the bottom rail. For bottom rail to top rail stress, ESD current flows from the bottom rail to the top rail. A rail clamp circuit is typically a fundamental component in providing a discharge path for ESD polarities which cause the first current electrode of the rail clamp to be more positive than its second current electrode. For polarities which cause the second current electrode of the rail clamp to be more positive than the first, a power bus diode normally provides an ESD dissipation path. This power bus diode often exists by default in an integrated circuit and is normally reversed biased during normal operation.

ESD discharges are brief transient events that are usually less than one microsecond in duration. Furthermore, the rise times associated with these brief pulses are usually less than approximately twenty nanoseconds. When ESD pulses are applied to the I/O pads of a chip, they produce similar brief, quickly rising potentials on the power supply rails due to the presence of ESD protection. The rail clamp circuit must be able to detect these fast transients and begin conducting so as to shunt the resulting ESD current. However, the rail clamp must not respond to the much slower rise times (greater than 1 millisecond) which are present on the power supply rails during normal power-up events in usual chip operation. If the ESD rail clamp were to trigger and conduct during normal power-up events, the desired operation of the IC could be compromised. Furthermore, in addition to triggering when needed for ESD protection, the rail clamp circuits must stay in a highly conductive state for the entire duration of the ESD pulse so that all of the ESD energy is safely discharged. If the rail clamp circuit were to shut-off prematurely, damaging potentials would build up quickly between the power rails and cause device failure.

It is known to place a rail clamp in the bottom rail pads in the chip that are responsible for supplying power connections for the IC. The rail clamp may also be placed in the top rail pads. These placements are sometimes made so that numerous I/O cells share ESD rail clamps, ensuring more robust ESD protection and reduced die area. Alternatively, the size of an individual rail clamp can be reduced, in order to conserve die area, if more than one clamp can be relied upon to conduct ESD current. In general, the sum total of parasitic power and ground rail resistances around the ESD discharge loop sets the limit on how far apart ESD rail clamps may be spaced in order to achieve a given level of ESD protection. One of the overall design goals is to keep the maximum voltage that occurs at the bond pad during an ESD discharge within acceptable limits so that damage does not occur in sensitive circuit elements.

In an effort to mitigate the effects of parasitic bus resistance, ESD rail clamps may be distributed locally in the I/O cells themselves. In this manner, several ESD rail clamps participate in the ESD event to provide robust protection. In this way, the effects of power and ground rail resistances may also be reduced in comparison with placing fewer, larger clamps in more centralized locations. In general, one skilled in the art is required to balance the tradeoff among ESD protection, resistance, and chip area.

Due to these and other problems, a need exists for circuits and methods that provide microelectronic circuits with reduced area, low leakage, and with the ability to withstand ESD events without adversely impacting the performance of the functional circuit path during normal operation.

SUMMARY OF THE INVENTION

In carrying out the principles of the present invention, in accordance with preferred embodiments thereof, methods and circuits of the invention are described with reference to exemplary embodiments providing ESD protection.

According to aspects of preferred embodiments of the invention, ESD protection circuitry includes a timing circuit operably coupled between the high supply side and low supply side of an associated circuit. The timing circuit has an RC node used for triggering a series of inverters configured to control an ESD dissipation device operably coupled to the high supply side node and the low side supply node of the circuit. A feedback transistor network is provided for ensuring that the ESD dissipation device is held in a highly conductive state during an ESD event.

According to another aspect of the invention, the ESD dissipation device is a PMOS transistor.

According to another aspect of the invention, CMOS inverters are used to control the ESD dissipation device.

The invention provides advantages including but not limited to providing effective ESD shunting responsive to the occurrence of ESD events. The invention may be implemented in ESD circuits with reduced area and reduced current leakage. These and other features, advantages, and benefits of the present invention can be understood by one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to the references in the figures unless otherwise noted. Descriptive and directional terms used in the written description such as first, second, top, bottom, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
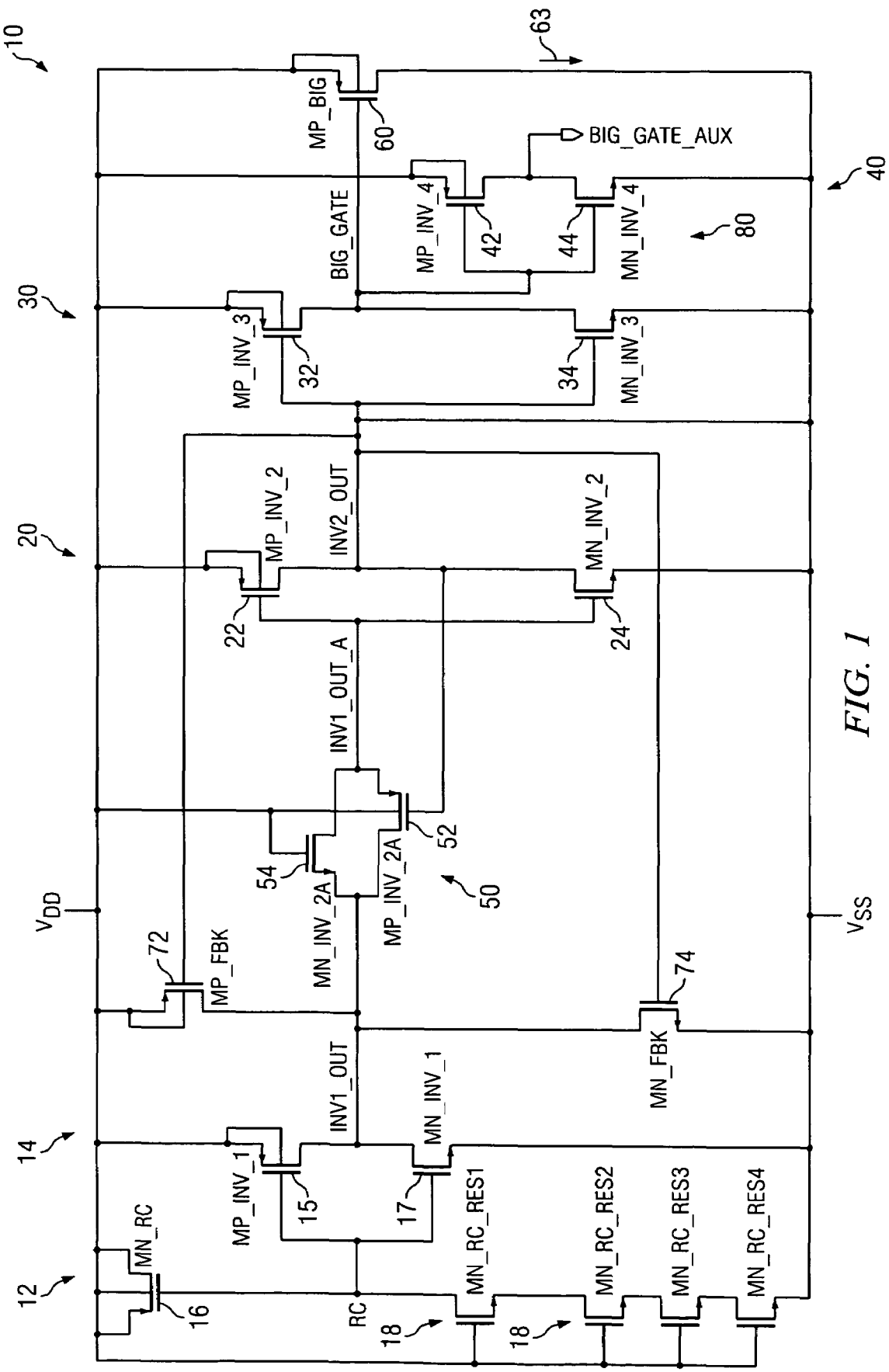
FIG. 1 is a schematic diagram of an example of a preferred embodiment of an ESD protection circuit according to the invention.

Referring primarily to FIG. 1, a schematic diagram of an exemplary preferred embodiment of a rail clamp circuit 10 according to the invention is shown. The example is shown and described in order to provide an illustration of a preferred configuration for the implementation of the invention. It will be appreciated by those skilled in the arts that various alternative implementations may be used without departure from the invention. The circuit 10 includes a timing circuit 12, a first CMOS inverter circuit 14, a second inverter circuit 20, a third inverter circuit 30, a fourth inverter circuit 40, a feedback control circuit 50, an ESD dissipation device 60, a feedback NMOS device 74 and a feedback PMOS device 72.

The timing circuit 12, functions as an RC circuit, preferably implemented with a PMOS transistor 16 that serves as a capacitor and one or more NMOS transistor 18 which operates as a resistor. Preferably, multiple resistance transistors 18 are used. PMOS transistor 16 has its first and second current electrodes and its well electrode coupled to the top supply rail VDD. The control electrode of transistor 16 is coupled to node RC. The NMOS transistors 18 form a series chain, where the drain electrode of a lower element in the chain is connected to the source electrode of the next upper element in the chain. The topmost drain electrode is coupled to node RC and the bottommost source electrode is coupled to VSS. The control electrodes of the resistance transistors 18 are coupled to VDD.

The first inverter 14 is preferably configured of a PMOS transistor 15 and NMOS transistor 17. PMOS transistor 15 has its source and well terminals coupled to the VDD rail, its drain terminal coupled to node INV1_OUT, and its control electrode coupled to node RC. NMOS transistor 17 has its source electrode coupled to node VSS, its drain electrode coupled to node INV1_OUT and its control electrode coupled to node RC.

In a similar configuration, the second inverter 20 is preferably implemented using a PMOS transistor 22 and an NMOS transistor 24. PMOS transistor 22 has its source and well terminals coupled to the top rail VDD, its drain terminal coupled to node INV2_OUT, and its control electrode coupled to node INV1_OUT_A. NMOS transistor 24 has its source electrode coupled to node VSS, its drain electrode coupled to node INV2_OUT, and its control electrode coupled to node INV1_OUT_A.

The third inverter 30 is also preferably implemented using a PMOS transistor 32 and an NMOS transistor 34. PMOS transistor 32 has its source and well terminal coupled to the top rail VDD, its drain terminal coupled to node BIG_GATE, and its control electrode coupled to node INV2_OUT. NMOS transistor 34 has its source electrode coupled to node VSS, its drain electrode coupled to node BIG_GATE, and its control electrode coupled to node INV2_OUT.

As shown, the fourth inverter 40 is preferably implemented using a PMOS transistor 42 and an NMOS transistor 44 as well. PMOS transistor 42 has its source and well terminals coupled to the top rail VDD, its drain terminal coupled to node BIG_GATE_AUX, and its control electrode coupled to node BIG_GATE. NMOS transistor 44 has its source electrode coupled to node VSS, its drain electrode coupled to node BIG_GATE_AUX, and its control electrode coupled to node BIG_GATE. The third and fourth inverters form the ESD discharge device predriver stage 80, which is responsible for applying the correct polarity needed to place the ESD dissipation device 60 into a conductive state during an ESD discharge. For example, if an NMOS ESD dissipation device were used instead of a PMOS, node BIG_GATE_AUX would be coupled to the control electrode of this device. In general, node BIG_GATE and BIG_GATE_AUX are the complements of each other and one skilled in the art will be able to determine which polarity is needed to drive a particular choice of ESD dissipation device 60.

The feedback control circuit 50 is preferably implemented using a PMOS transistor 52 and an NMOS transistor 54. PMOS transistor 52 has its drain terminal coupled to node INV1_OUT and its well terminal coupled to the top rail VDD. The source terminal of PMOS transistor 52 is coupled to node INV1_OUT_A, and its control electrode is coupled to node INV2_OUT. NMOS transistor 54 has its source electrode coupled to node INV1_OUT, its drain electrode coupled to node INV1_OUT_A, and its control electrode coupled to the top rail VDD.

An ESD dissipation device, preferably a PMOS transistor 60, has its source terminal coupled to the top rail VDD, its drain terminal coupled to the bottom rail VSS, and its control electrode coupled to node BIG_GATE. The well electrode is also coupled to the top rail VDD.

A PMOS feedback transistor 72 has its source and well terminals coupled to the top rail VDD and its drain terminal coupled to node INV1_OUT. The control electrode is coupled to node INV2_OUT. Finally, NMOS feedback transistor 74 has its source electrode coupled to the bottom rail VSS, its drain electrode coupled to node INV1_OUT and its control electrode coupled to node INV2_OUT.

Figure 2:
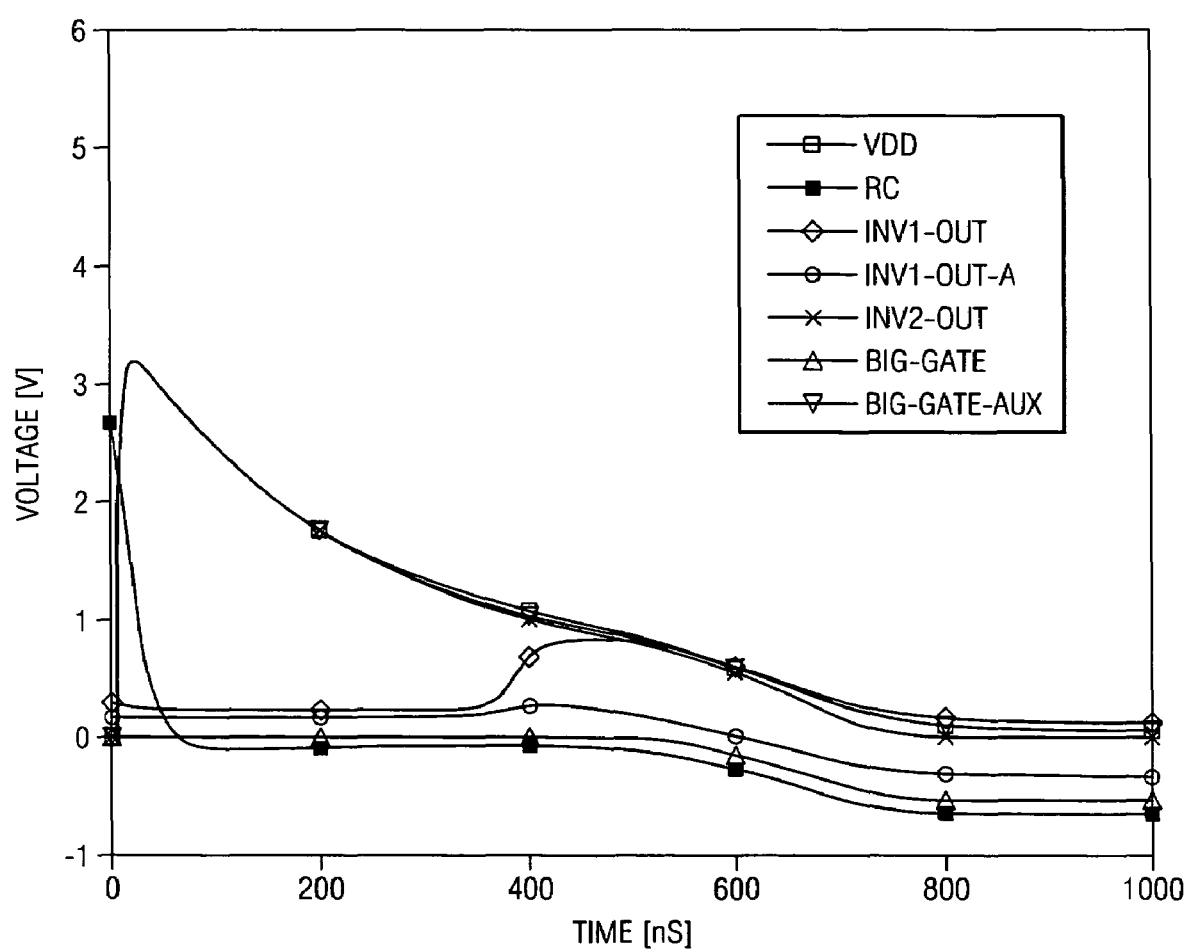
FIG. 2 is a graphical representation of an example of changes in voltage at selected nodes during the operation of the circuit of FIG. 1.
Figure 3:
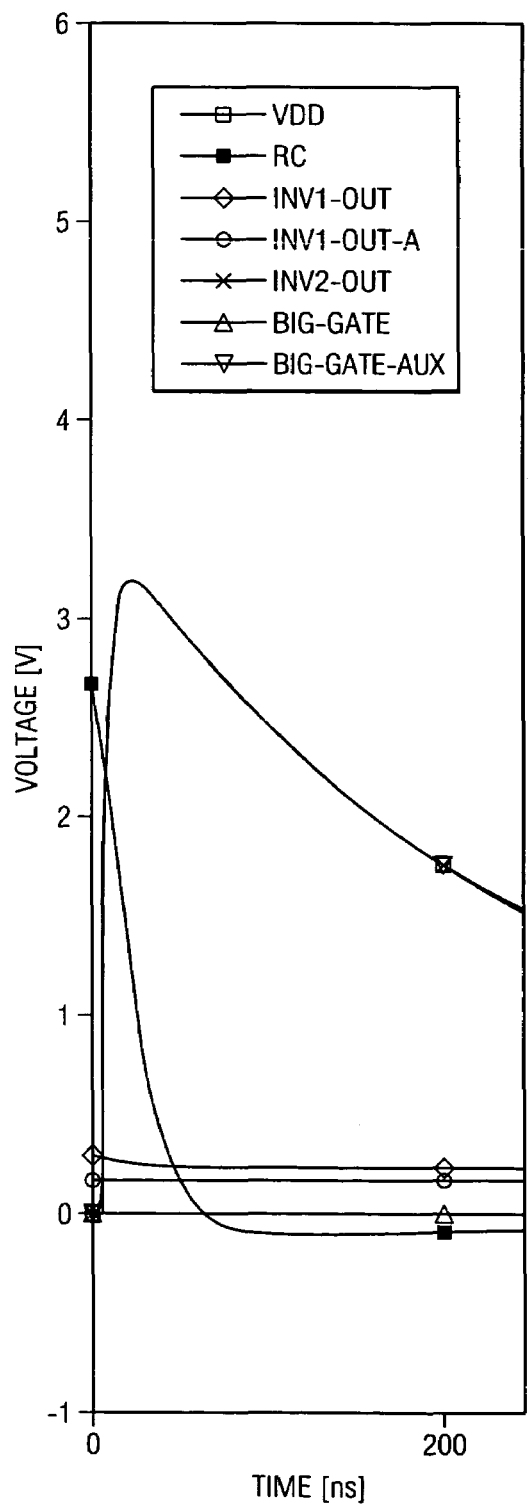
FIG. 3 is a close-up view of a selected portion of the graphical representation of the changes in voltage at selected nodes during the operation of the circuit of FIG. 2.
Figure 4:
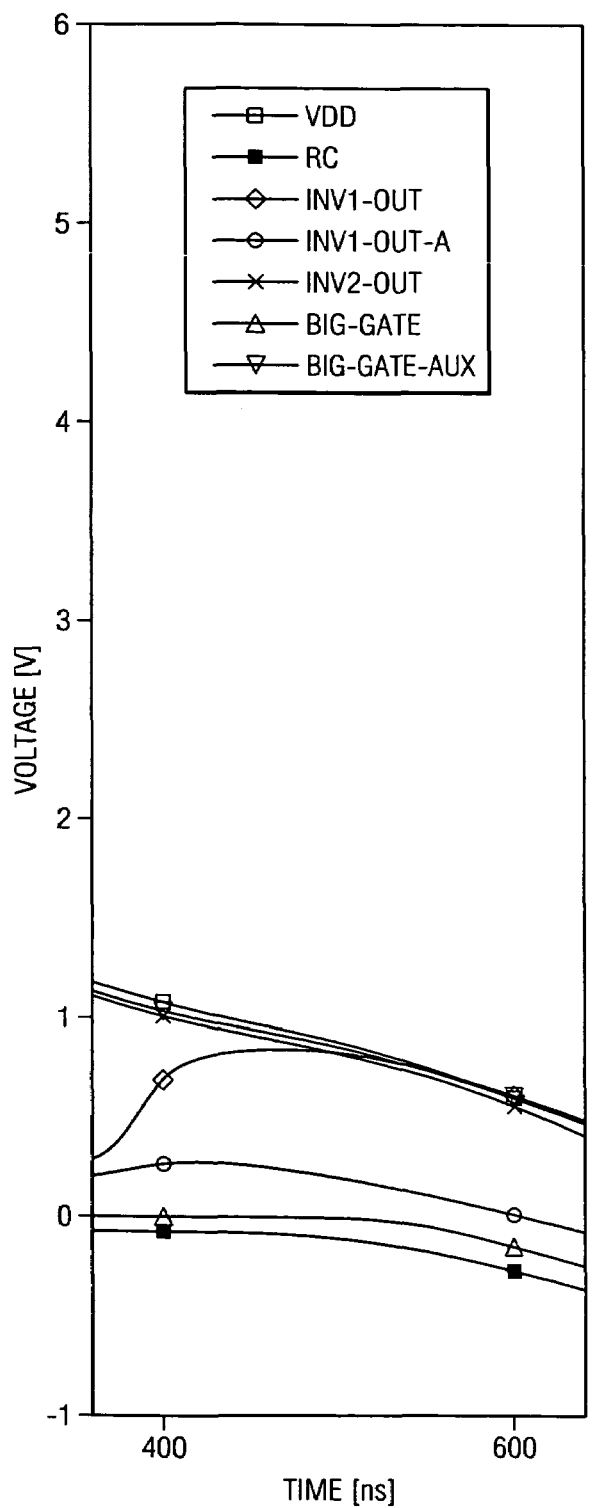
FIG. 4 is a close-up view of another selected portion of the graphical representation of the changes in voltage at selected nodes during the operation of the circuit of FIG. 2.

The operation of the invention is further described with reference to the exemplary circuit 10 depicted in FIG. 1. FIG. 2 shows the voltages of all the nodes in FIG. 1 for the entire duration of an ESD discharge. FIG. 3 depicts the node voltages in the circuit for the initial triggering portion of the ESD discharge and is a zoomed-in view of FIG. 2. FIG. 4 depicts the latched portion of circuit operation and is a zoomed-in view of FIG. 2. Assuming initially, for the sake of example, the absence of an ESD event, the circuit 10 is not energized and all node voltages can be considered to be at zero potential. Assuming a fast positive-going ESD transient on the power rail VDD, node RC rises instantaneously along with the VDD potential due to the displacement current flow in the capacitor 16, preferably a PMOS transistor. Transistor 17 of the first inverter 14 is placed in a conductive state due to the positive voltage at its gate. This couples the output of the first inverter 14 towards ground. The output of the first inverter 14, at node INV1_OUT is coupled to the input of the second inverter 20 at node INV1_OUTA, causing the PMOS transistor 22 to conduct. In this example, the path taken-through the feedback control circuit 50 is through NMOS transistor 54. The resulting positive output from the second inverter 20 at node INV2_OUT, causes the NMOS transistor 34 at the third inverter 30 to turn on, which in turn couples node BIG_GATE towards ground, switching on the ESD dissipation device 60. When the ESD dissipation device 60 is in a conducting state, the excessive ESD current is shunted as shown by arrow path 63 (see also FIGS. 2 and 3). The input to the fourth inverter 40 is also coupled to the node BIG_GATE, turning on PMOS transistor 42, which allows current to flow from the top rail VDD to node BIG_GATE_AUX. Node BIG_GATE_AUX may be used by other elements in the ESD network (not shown) or to drive a complementary ESD dissipation device as previously described.

Once the potential of node INV2_OUT has risen to a threshold potential above the bottom rail VSS, the NMOS feedback transistor 74 begins to conduct. Current conduction in transistor 74 further pulls the potential of node INV1_OUT towards ground, which further enhances current conduction in transistor 22, via transistor 54. In the limit, the potential of nodes INV1_OUT and INV1_OUT_A are at ground VSS, and the potential of node INV2_OUT is identical to that of the top rail VDD. This completes a feedback loop, which "latches" ESD dissipation transistor 60 into a conductive state (see also FIGS. 2 and 4). Since the potential of node INV2_OUT is tightly coupled to VDD, the potential of node BIG_GATE is at ground. This ensures that the ESD dissipation transistor 60 conducts as strongly as possible.

Once the ESD dissipation transistor 60 has been latched into a conductive state, the RC timing circuit 12 may be permitted to time out (see FIGS. 2 and 3). This is advantageous since this means that the duration of the RC time constant can be significantly shorter than the duration of the ESD event, which permits the use of an RC network with a reduced physical area.

While the rail clamp circuit 10 is transitioning into this conductive state, PMOS feedback transistor 72 momentarily impedes the collapse on node INV1_OUT to ground, as long as the potential of node INV2_OUT is near ground prior to the full turn-on of transistor 60. This is desirable since it functions as a mechanism to prevent false triggering. As the potential on node INV2_OUT begins to rise, feedback transistor 72 stabilizes to an off state, which then accelerates the collapse of node INV1_OUT, which in turn elevates node INV2_OUT via enhanced conduction in transistors 17 and 22. One skilled in the art will appreciate that the dynamic current among the inverter transistors and feedback transistors may be adjusted to achieve a minimum critical voltage needed on the rail VDD to trigger the rail clamp once the transient change on the rail VDD has caused the initial action.

The timing out of RC circuit 12 means that the NMOS resistors 18 are allowed sufficient time to discharge the potential on node RC toward ground VSS. This in turn causes PMOS device 15 to begin to conduct. This action tends to elevate the potential of node INV1_OUT towards the top rail VDD, tending toward turning off the ESD device 60. The potential on node INV1_OUT is influenced by the selection of the current balance between transistor 15 and feedback transistor 74. The settling potential of this node INV1_OUT is preferably set such that the clamp 10 stays on until a minimum critical residual energy is reached in the ESD pulse. Once the energy in the ESD pulse has reached this critical point, the latching action of the circuit 10 releases and ESD transistor 60 is again placed in a non-conductive state. By this time, the ESD pulse does not have sufficient energy to cause damage to the integrated circuit. Feedback control circuit 50 is instrumental in guaranteeing that the clamp remains in a conductive state for a longer period of time than would be exhibited otherwise. Once the RC circuit 12 has timed out, transistor 15 is on and begins to pull against feedback transistor 74. The control electrode of transistor 74 is coupled to the VDD potential through transistor 22. As the potential of the VDD rail continues to drop, a point is reached near the threshold voltage of transistor 74 where there is no longer sufficient potential on the gate of transistor 74 to keep it in a conductive state. At this point the potential of node INV1_OUT rises due to the pulling action of transistor 15. If node INV1_OUT were directly coupled to the input of inverter 20, the jump in the potential of INV1_OUT could turn-off the clamp prematurely. However, by coupling node INV1_OUT to the input of inverter 20 through feedback control circuit 50, this "jump" in potential is blocked since the highest potential NMOS transistor 54 will pass is VDD-VTN. Thus, the magnitude of the jump in node INV1_OUT is reduced which keeps the clamp in a conductive state longer. This is shown in FIG. 4. Note that transistor 52 in feedback control circuit 50 is an off state during this time. Transistor 52 is necessary for normal operation where it is important to pass a full level VDD magnitude to node INV1_OUT_A to keep the clamp in an off state. This feedback control circuit is necessary in semiconductor manufacturing processes where the threshold voltage of the NMOS device differs from that of the PMOS device whether by design or expected drift in manufacturing parameters.

In general it is important that the ESD rail clamp 10 remain in a non-conductive state during system power-up and normal operation. In normal applications during power-up, the system power supply will ramp up at a predefined rate, which is usually in the range of several milliseconds to several tens of milliseconds. This is orders of magnitude slower than the rise times seen during ESD events. As before, for the sake of example, it is assumed that the circuit 10 is initially un-powered and that all internal node voltages are at essentially zero volts. During power-up, in response to the relatively slowly increasing voltage rate on the rail VDD, the RC node in FIG. 1 remains at a potential near ground since the NMOS resistors 18 effectively remove any displacement charge deposited by PMOS capacitor 16. This displacement current is minimal since the dV/dT of the power rail is low. If node RC remains near ground, then node INV1_OUT remains at the potential of the top rail VDD via current conduction through transistor 15. Since the node INV1_OUT is essentially at the potential of the rail VDD, node INV2_OUT is coupled to ground VSS due to current conduction in transistor 24. This maintains ESD discharge transistor 60 in a non-conductive state since the output of inverter 30 will be at the VDD potential. Feedback transistor 72 is also retained in a conductive state, which further couples node INV1_OUT to the top rail VDD. It should be understood that the feedback transistor configuration of the invention helps to prevent false triggering.

Thus, the invention provides methods and circuits that provide microelectronic circuits with the ability to withstand ESD events without adversely impacting the performance of the functional circuit path during normal operation. The methods and devices of the invention provide advantages including but not limited to savings in die area, improved ESD protection capabilities, and reduced leakage current. While the invention has been described with reference to certain illustrative embodiments, the methods and apparatus described are not intended to be construed in a limited sense. Various modifications and combinations of the illustrative embodiments as well as other advantages and embodiments of the invention will be apparent to persons skilled in the art upon reference to the description and claims.

I claim:

1. An ESD protection circuit comprising:
   a timing circuit operably coupled to a high supply side node and a low supply side node, and having an RC node;
   a first inverter operably coupled to the high supply side node and the low side supply node, and having a control node coupled to the RC node, and an output node;
   a second inverter operably coupled to the high supply side node and the low side supply node, and having a control node and an output node;
   a first feedback transistor operably coupled to the high supply side node and the output node of the first inverter, and having a control terminal coupled to the output node of the second inverter;
   a second feedback transistor operably coupled to the low supply side node and the output node of the first inverter, and having a control terminal coupled to the output node of the second inverter;
   a feedback control circuit operably coupled between the output node of the first inverter and the control node of the second inverter;
   an ESD dissipation device predriver stage coupled to the output node of the second inverter, and coupled to the input node of an ESD dissipation device;
   an ESD dissipation device operably coupled to the high supply side node and the low side supply node, and having a control node coupled to the output node of the ESD dissipation device predriver; and
   wherein the feedback control circuit further comprises a NMOS transistor and a PMOS transistor operably coupled between the output node of the first inverter and the control node of the second inverter, the NMOS transistor having a control terminal coupled the high side supply node, and the PMOS transistor having a control terminal coupled the output node of the second inverter and a well terminal coupled to the high side supply node.

2. The circuit of claim 1 wherein the ESD dissipation device predriver comprises an odd number of inversion stages.

3. The circuit of claim 1 wherein the ESD dissipation device predriver comprises and even number of inversion stages.

4. The circuit of claim 1 wherein the ESD dissipation device predriver comprises a direct connection to the ESD dissipation device.

5. The circuit of claim 1 wherein the ESD dissipation device comprises a PMOS transistor.

6. The circuit of claim 1 wherein the ESD dissipation device comprises an NMOS transistor.

7. The circuit of claim 1 wherein the timing circuit further comprises a capacitor coupled between the high side supply node and the RC node and one or more resistors coupled between the low side supply node and the RC node.

8. The circuit of claim 7 wherein the capacitor further comprises a PMOS transistor.

9. The circuit of claim 7 wherein the one or more resistors further comprise NMOS transistors.

10. The circuit of claim 1 wherein the inverters comprise CMOS inverters.

11. The circuit of claim 1 wherein the first feedback transistor comprises a PMOS transistor.

12. The circuit of claim 1 wherein the second feedback transistor comprises an NMOS transistor.

* * * * *